United States Patent [19]
Vanderpot et al.

[11] Patent Number: 5,984,391
[45] Date of Patent: Nov. 16, 1999

[54] MICROFEATURE WAFER HANDLING APPARATUS AND METHODS

[75] Inventors: John W. Vanderpot, Boxford; John D. Pollock, Rowley, both of Mass.

[73] Assignee: Novellus Systems, Inc., San Jose, Calif.

[21] Appl. No.: 08/883,204

[22] Filed: Jun. 26, 1997

Related U.S. Application Data

[60] Provisional application No. 60/037,115, Feb. 3, 1997.

[51] Int. Cl.$^6$ .............................. B25J 15/00; B65G 49/07
[52] U.S. Cl. .............................. 294/1.1; 294/61; 294/902; 414/935; 901/30
[58] Field of Search .............................. 294/1.1, 61, 64.1, 294/902; 118/500, 502; 269/47, 53, 54, 900; 414/744.5, 749, 935, 937, 939, 941; 901/30, 31, 39

[56] References Cited

U.S. PATENT DOCUMENTS

| | | | |
|---|---|---|---|
| 4,214,741 | 7/1980 | Crawford | 294/61 X |
| 4,591,044 | 5/1986 | Ogami et al. | 414/935 X |
| 5,061,144 | 10/1991 | Akimoto et al. | 414/935 X |
| 5,116,094 | 5/1992 | Jones | 294/61 X |
| 5,626,675 | 5/1997 | Sakamoto et al. | 414/935 X |
| 5,711,646 | 1/1998 | Ueda et al. | 414/941 X |
| 5,823,736 | 10/1998 | Matsumura | 414/935 X |

*Primary Examiner*—Johnny D. Cherry
*Attorney, Agent, or Firm*—Duft, Graziano & Forest, PC; Curtis A. Vock, Esq.

[57] ABSTRACT

The invention provides wafer handling apparatus for use with a wafer handling mechanism of the type that supports and transports wafers through and during semiconductor processes. Typically, the wafer has a first surface for semiconductor processing and a second surface having a surface finish with microfeatures therein. The invention utilizes at least three prongs extending from the mechanism and arranged to support the wafer. A stylus tip—preferably made from diamond—resides at a distal end of each prong. Each tip has a point that is smaller than at least some of the microfeatures of the second surface of the wafer such that the interaction of the tips with the microfeatures resists lateral movement of the wafer relative to the tips when the wafer rests on the tips by the force of gravity. This interaction is sufficient to move the wafer without substantial contribution from the coefficient of friction between the tips and the wafer. The invention solves the problems of the prior art associated with outgassing by rubber pads and low coefficients of friction associated with quartz pads. Motors with feedback control adjust the speed at which the prongs interact with the wafers so as to prolong tip life.

17 Claims, 7 Drawing Sheets

MICROFEATURE WAFER HANDLING APPARATUS AND METHODS

RELATED APPLICATIONS

This application claims the benefit of U.S. provisional application Ser. No. 60/037,115, filed on Feb. 3, 1997.

BACKGROUND

The prior art is familiar with wafer handling systems. Typically, semiconductor wafers are processed through a variety of chambers and are mechanically carried between chambers by a robotic transport. These wafers are for example eight inches in diameter and have one planar surface subjected to semiconductor processes. The robotic transport supports the wafer on the other surface; so typically the first surface is upwards and the robotic transport supports the second surface underneath the wafer.

To accomplish this, the robotic transport typically utilizes a three-prong (or more) fixture that supports the wafer during transport. The prongs of the fixture are covered with a non-abrasive material, relative to the wafer, such as rubber, and are sized so as to provide sufficient surface area contact to prevent slipping during horizontal movement of the wafer through the chambers.

Figure 1:
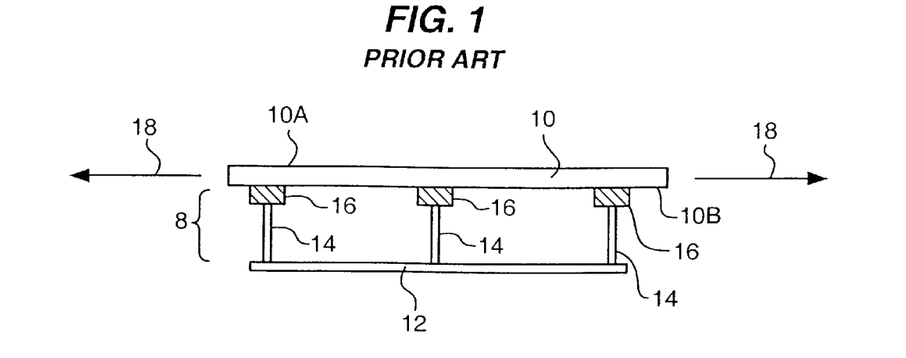
FIGS. 1 and 1A show wafer handling fixturing of the prior art.
Figure 1A:
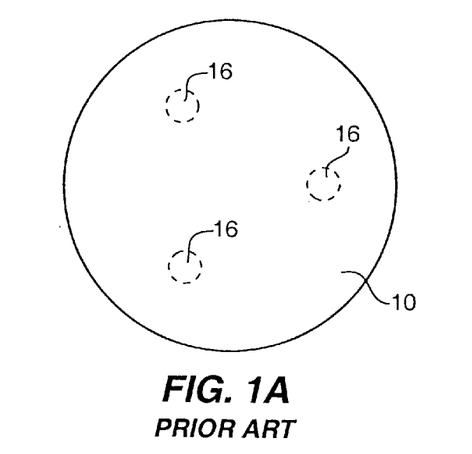

FIGS. 1 and 1A illustrate prior art wafer handling fixturing 8. FIG. 1 shows a side view of the fixturing 8 supporting a wafer 10. The wafer 10 has a first surface 10a and a second surface 10b. The first surface 10a is used to deposit selective semiconductor materials onto the wafer 10, such as by room temperature ion implantation. The fixturing 8 includes three representative prongs 14, supported by a base 12, that are capped with rubber pads 16 to provide good friction contact with the wafer 10 during movement 18. The pads 16 are typically between about 1/16" to 1/4" in diameter to ensure good contact with the surface 10b. FIG. 1A shows a top view of the wafer 10 and the arrangement of the pads 16 made so as to provide sufficient support. The pads 16 of FIG. 1A are illustratively shown as dotted lines.

The problem with the fixturing 8 of FIGS. 1 and 1A is that it does not survive in processes involving high temperatures, such as plasma CVD, thermal CVD, plasma vapor deposition ("PVD") and etch, and annealing. These processes can involve temperatures as high as six hundred degrees Celsius. Further, processes such as CVD and PVD are typically done in an evacuated environment; and rubber outgasses, presenting unwanted particulates and material within the deposition process. To overcome this problem, the prior art has replaced the pads 16 with a temperature-resistant material such as quartz. While this overcomes the high temperature problem, quartz and other temperature-resistant materials used in the prior art, such as brass and alumina, have low coefficients of friction with silicon. Therefore, the movements 18 must occur at low lateral accelerations so as to ensure that the wafer 10 stays on the fixturing 8 during transport. For example, typical accelerations for rubber pads can be up to about 0.5 g; while accelerations for quartz are at most 0.1 g. This reduces efficiency and production yield.

It is, accordingly, an object of the invention to provide apparatus which reduces or eliminates the afore-mentioned problems of the prior art.

A further object of the invention is to provide wafer handling fixturing that is resistant to high temperatures and that achieves high lateral acceleration, as compared to the prior art.

These and other objects will become apparent in the description which follows.

SUMMARY OF THE INVENTION

In one aspect, the invention provides wafer handling apparatus with diamond-tipped three-prong (or more) fixturing to support the wafer during processing. The diamond-tipped elements extend and support the wafer underneath, and interact with the microfeatures of the wafer surface so as to restrict lateral movement of the wafer relative to the fixturing.

In another aspect, the invention utilizes the theory that the lateral force required to break the static friction between the wafer and the pads is equal to the normal force (i.e., generated by the weight of the wafer) times the coefficient of friction between the materials (i.e., the wafer substrate and the pad material). Note that, at least to first order, the static friction is independent of pad surface area. It is desirable to have high lateral friction so that the wafer can be transported with relatively high lateral accelerations. In accord with the invention, each prong and pad of the prior art are replaced with a sharp, pointed tip, such as a diamond stylus, which imbeds within the microsurface structure of the wafer, restricting lateral motion and enabling high lateral accelerations.

In other aspects, the pointed tips are made of diamond. The shape of the tip is between about forty five degrees and one hundred and twenty degrees, and is selected as a trade-off between lateral resistance (i.e., caused by sharpness) and the wear of the tip over time. In a preferred aspect, the tip should also be resistant to abrasion by materials such as silicon and semiconductor films and oxides used in processes such as CVD. That is one reason why diamond works well: it is harder than other surfaces and will not be scratched.

The invention also provides for other tip surfaces, including sapphire, molybdenum, tungsten, and steel.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE DRAWINGS

Figure 2:
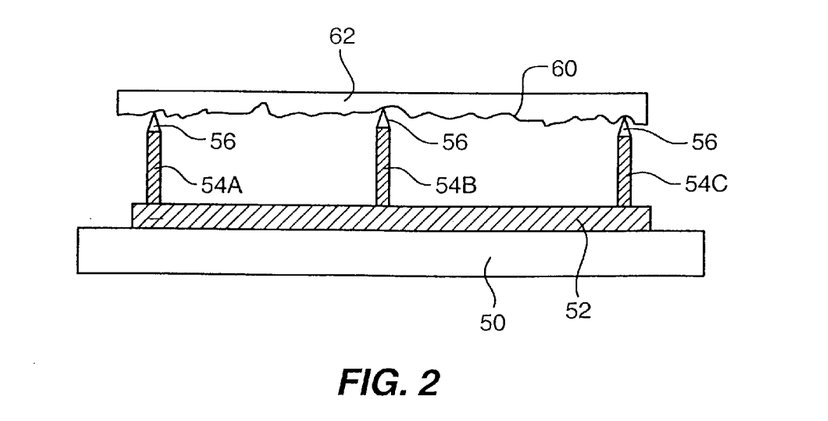
FIG. 2 shows a side view of a wafer handling system constructed according to the invention.

FIG. 2 shows a side view of a wafer handling system constructed according to the invention. A robotic transport 50 has fixturing 52 which includes three prongs 54a–54c. Each of the prongs 54a–54c has a diamond-tip 56 which is small relative to the microfeatures 60 of the wafer 62 (note, for clarity of illustration, that the microfeatures 60 and tips 56 are not shown to scale and are in fact much smaller as compared to the other elements illustrated).

Figure 3:
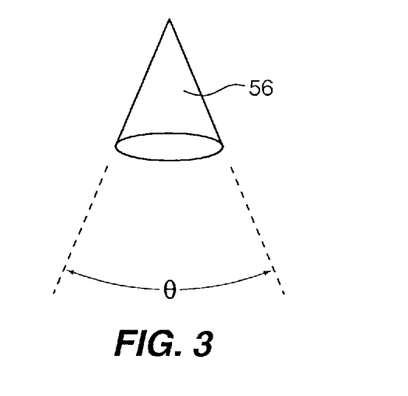
FIG. 3 shows a perspective view of one tip constructed according to the invention.

The shape of one of the tips 56 is illustrated in FIG. 3. Preferably the angle θ of the tip 56 is between about 45° and 120°, depending upon the desired tip life, wafer material, wafer surface finish, and other factors.

Figure 4:
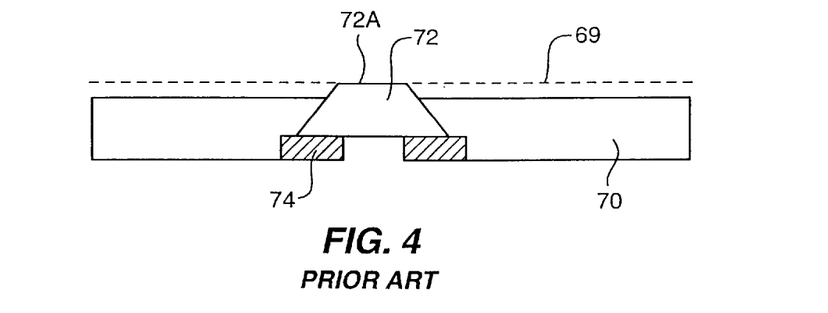
FIGS. 4 and 4A show an end effector and quartz pad configuration constructed in the prior art.
Figure 4A:
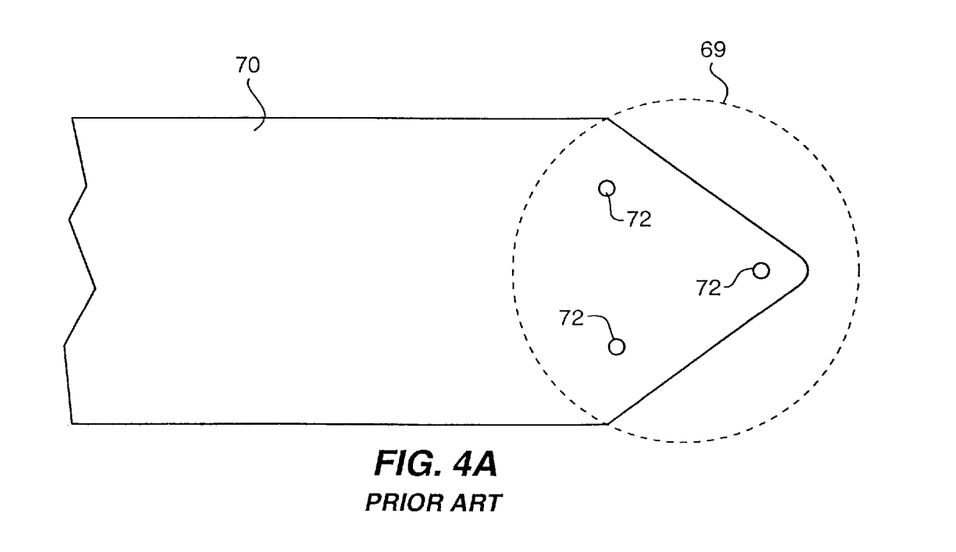

FIG. 4 illustrates, in a cross-sectional view, one prior art design of mounting a quartz pad 72 into an end effector 70, which is a term used to describe the robot arm that extends into and out of CVD process chambers. In FIG. 4, the stainless steel end effector 70 has a quartz pad 72 that is wedged and staked into the effector 70 via a stainless steel disk plug 74. Semiconductor wafers, such as shown by dotted line 69, rest on the top surface 72a of the pad 72. FIG. 4A shows, in a top view, further detail of the end effector 70, including pad placement relative to the wafer 69 at the end of the end effector 70.

Figure 5:
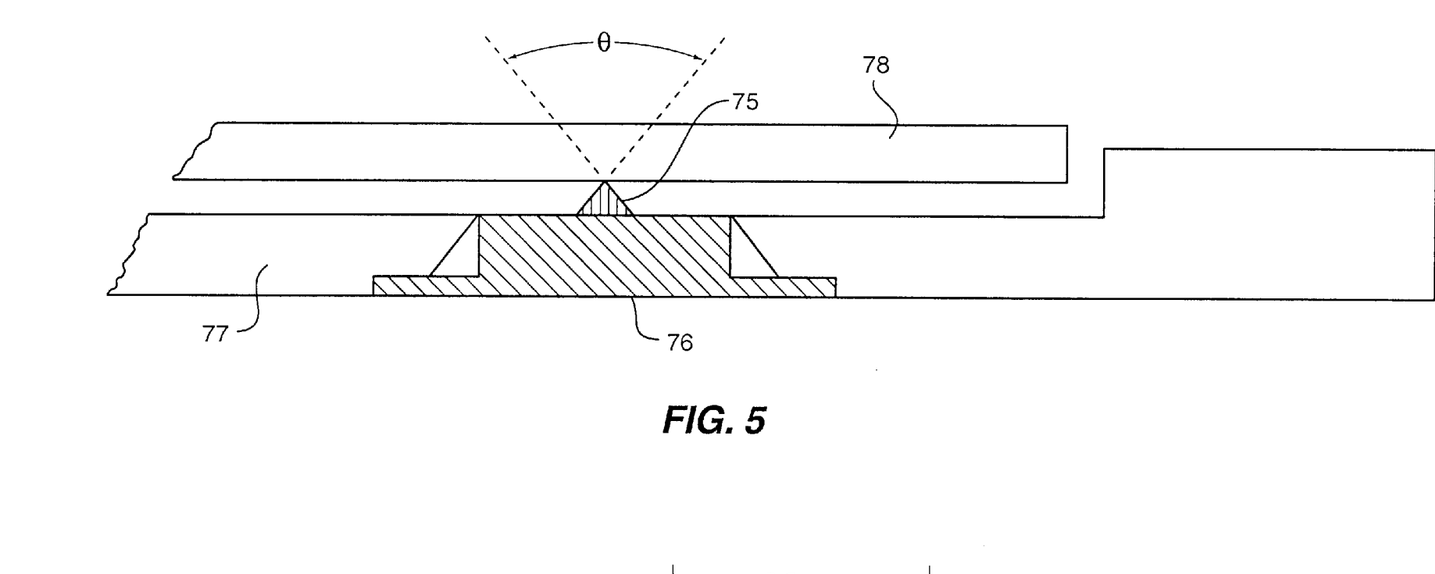
FIG. 5 shows one configuration of a diamond stylus and steel base combination used in accord with the invention.
Figure 5A:
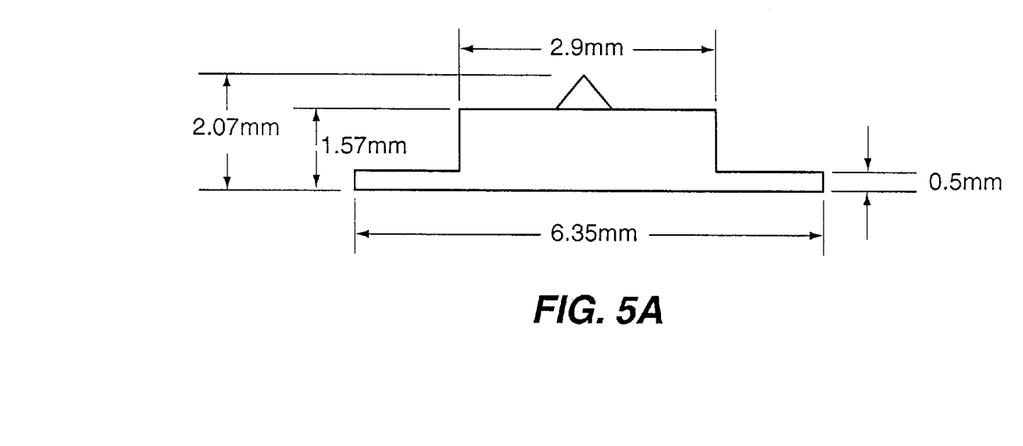
FIG. 5A shows a representative dimension of the combination of FIG. 5.

In accord with the invention, the plug 74 of FIG. 4 can be replaced by a diamond stylus 75 mounted on a steel base 76, or other equivalent material, such as illustrated in FIG. 5. The base 76 is then fit within an end effector 77 to support a wafer 78 during transport through one or more chambers and semiconductor processes. A typical end effector of the invention is made from 304 Stainless Steel. The base 76 is also suitably manufactured from 304 Stainless Steel. The shape of the stylus 75 is cut to an angle θ such as seventy five degrees. Exemplary design dimensions of the stylus/base combination are shown in FIG. 5A.

Diamond scribes that can be modified and used in accord with the invention can be purchased at Bruce Diamond Corporation, in Attleboro, Mass. These diamond scribes from Bruce Diamond Corporation include the following part-numbers HS-101A, HS-101S, HS-105A, HS-105S, MHS-500S, MHS-500A, HS-201, HS-301, HS-401A, HS-401S, MHS-600S, MHS-600A, UHS-800 and RHS; and can include choices of 60, 75, 90 and 120 degrees included angle for the tip. In accord with the invention, such scribes and tips are modified and constructed with the wafer handling system of the invention, such as that system shown in FIG. 2.

Figure 6:
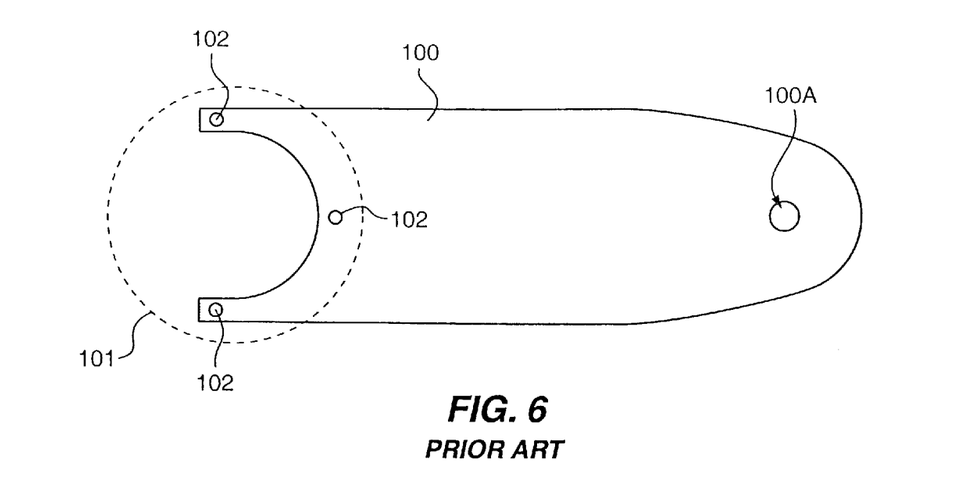
FIG. 6 shows a top view of a prior art end effector.
Figure 7:
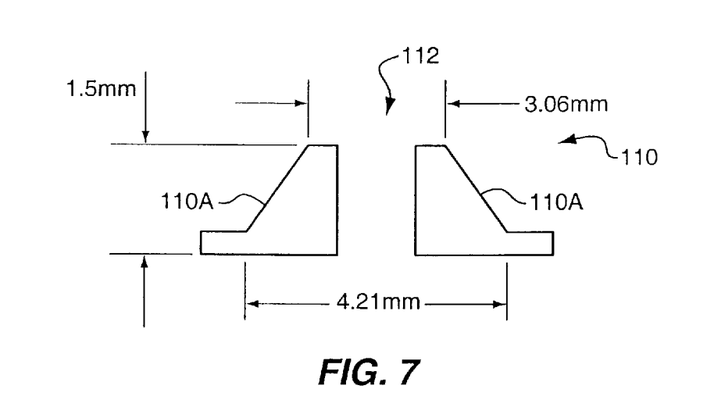
FIG. 7 shows a cross-sectional view of a plug used to accommodate a stylus tip within the end effector of FIG. 6, in accord with the invention.

FIG. 6 illustrates a top view of a typical prior art end effector 100 used in the transport of wafers such as the wafer 101 (illustratively shown as a dotted line). The end effector 100 is connected to other mechanisms via the through-hole 100a. FIG. 7 shows a plug 110, constructed according to the invention, that can be used to accommodate the through-holes 102 of the end effector 100 of FIG. 6 and such that a sharp stylus can easily be inserted into the end effector 100. By way of a typical example, the through-holes 102 can have a diameter of 3.2 mm to accommodate the rubber or quartz pads of the prior art. The plug 110 of FIG. 7 is thus shown with exemplary dimensions to fit within with the 3.2 mm diameter. The sloped sides 110a of the plug 110, FIG. 7, thus fit snug within such a diameter so that the plug 110 is firmly held within the effector 100.

Figure 8:
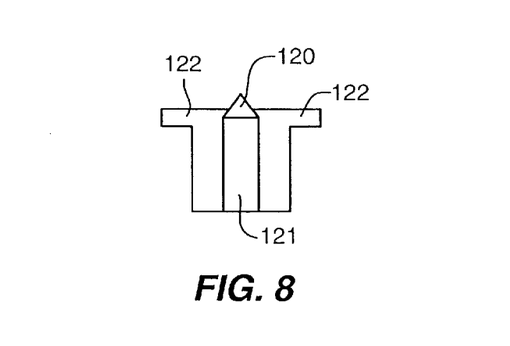
FIG. 8 shows a diamond stylus and sleeve that fit snugly within the plug of FIG. 7.

FIG. 8 shows a diamond tip 120 and stainless steel shank 121 mounted within a sleeve 122 that inserts snugly within the thru-hole 112 of plug 110 of FIG. 7. In combination, therefore, the plug 110 and the tip/shank/sleeve combination 120/121/122 operate to replace the prior art quartz or rubber pads with a diamond tipped support fixture constructed according to the invention. That is, the prior art rubber or quartz pads that exist in wafer handling systems can be retrofitted with a diamond stylus fixturing such as described in FIGS. 7 and 8.

Figure 9:
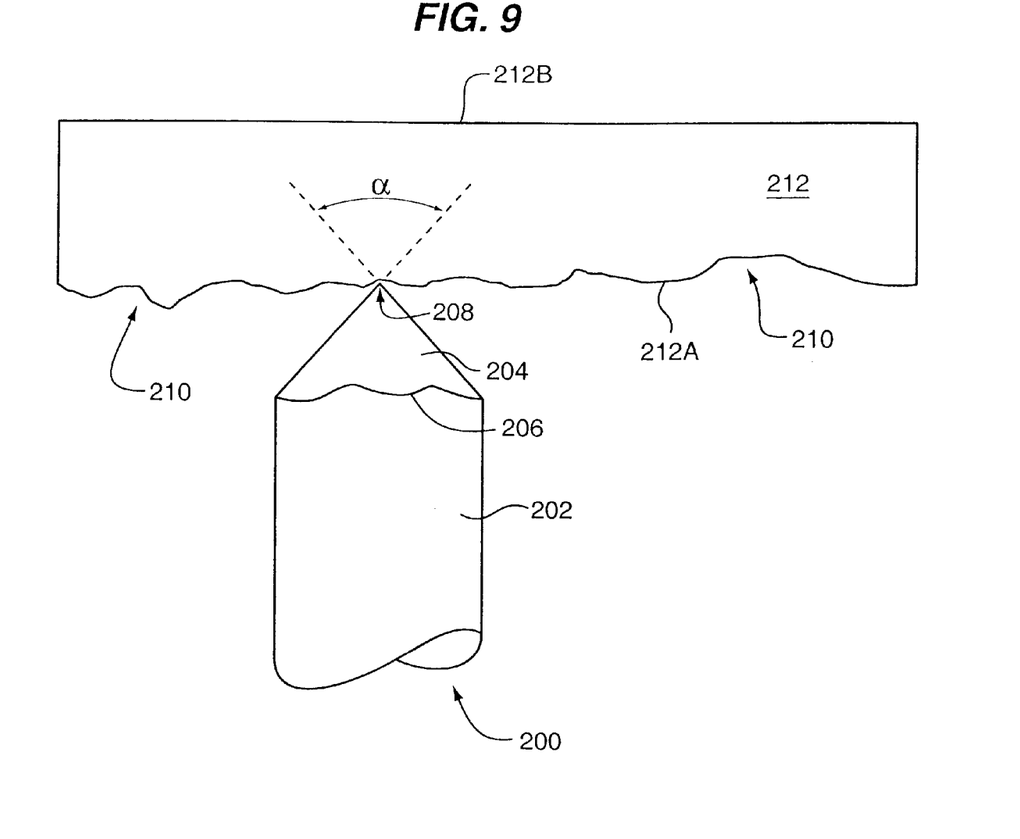
FIG. 9 shows one wafer handling stylus, constructed according to the invention, interacting with a semiconductor wafer.

FIG. 9 illustrates one diamond stylus 200 according to the invention such as for use as the tip 56 of FIG. 2. The stylus 200 includes a steel shank 202, an industrial diamond 204, and a braze joint 206 that connects the shank 202 to the diamond 204. The included angle α provides a sharp point 208 that fits within the microfeatures 210 of a wafer 212. The microfeatures 210 of the wafer 212 are typically defined by the semiconductor substrate manufacturer; and the surface 212a is generally unpolished. Such microfeatures are much less pronounced on the face 212b of the wafer 212, as illustrated, since that surface 212b is polished smooth.

Figure 9A:
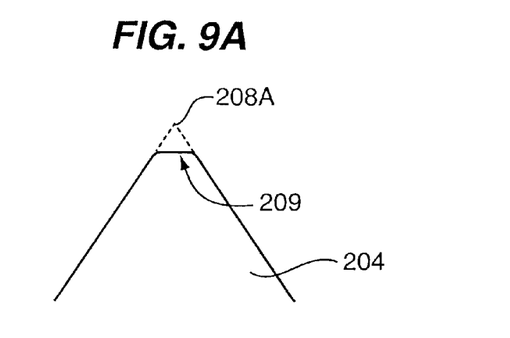
FIG. 9A shows further and microscopic detail of the point of the stylus of FIG. 9.

The point 208 is not, generally, perfectly sharp. Rather, there is a point openness that details how "sharp" the point is. The diamond 204 and point 208 are shown in more detail in FIG. 9A, including a theoretical point 208a and a flat portion 209 representing the real and microscopic detail of the point 208. Generally, the width, or flatness, of the portion 209 is between about 0.0005 and 0.0008 inch. The portion 209 can be made intentionally during manufacture; or the portion 209 can occur through normal use since material that extends to the theoretical tip 208a is very fragile.

The angle α is usually between about 45 and 120 degrees. Smaller angles make the tip sharper yet more fragile; while larger angles make the tip duller yet less fragile. The angle is thus a trade-off as to the particulars of the processes. For example, for processes requiring high throughput, the point 208 is subjected to high accelerations and, subsequently, stressful impacts with wafers. Under such conditions, it is expected that the point 208 will be dulled to some extent, such as to form a portion 209 of FIG. 9A.

Figure 9B:
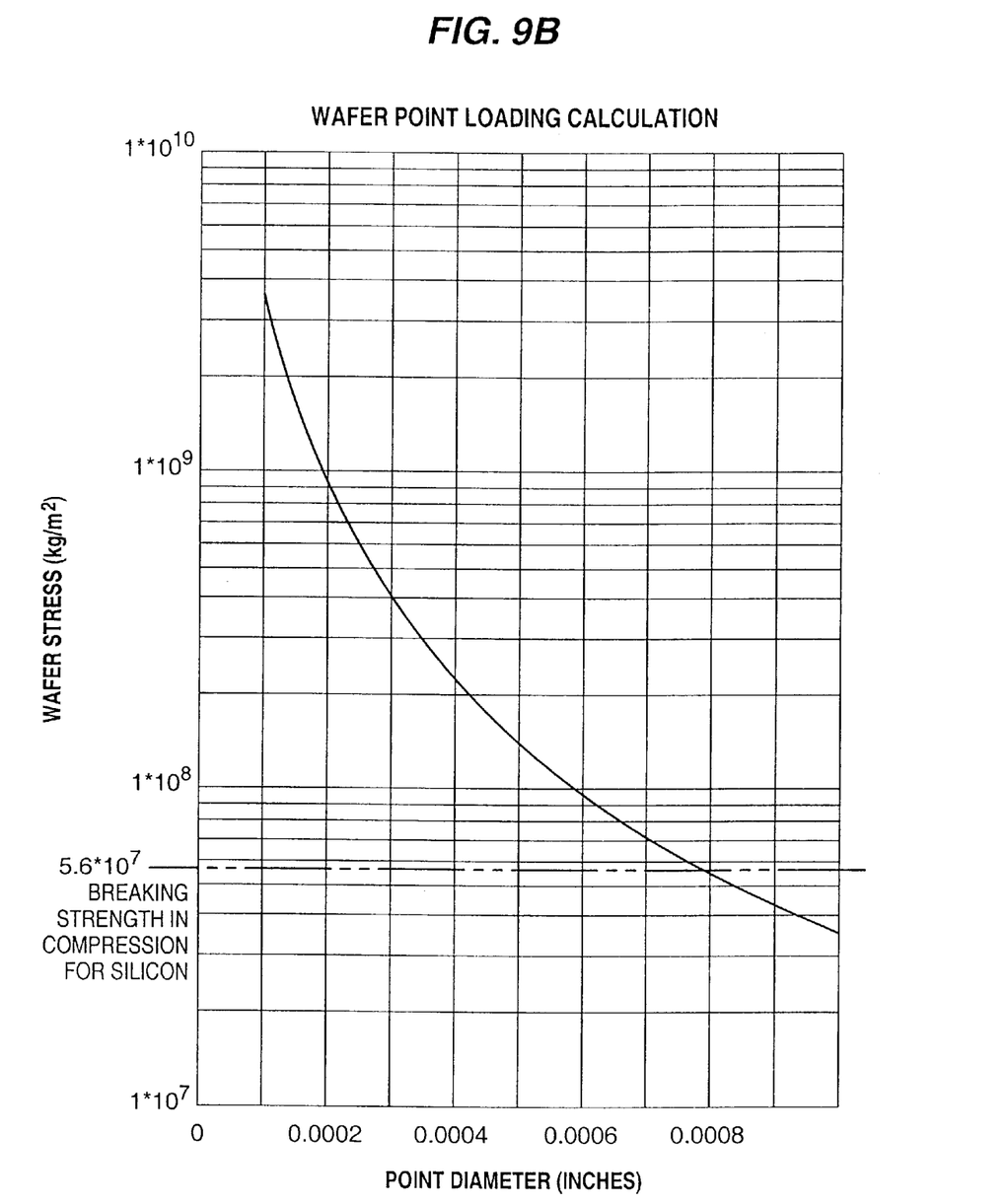
FIG. 9B illustrates a theoretical graph of stresses generated on silicon wafers when supported by three stylus tips of the invention.

However, even though blunting the end of the stylus reduces the likelihood of breaking the tip, a blunt tip more importantly increases the contact area between the tip and the wafer. A certain amount of contact area is needed in order to reduce the compressive stress on the wafer. Thus the contact area—for example, the portion 209, FIG. 9A—should be sized accordingly. The theoretical stress in the wafer is equal to the wafer weight divided by the number of support tips and divided by the contact area of each tip. This stress should be kept safely below the compressive strength of the wafer. For silicon wafers, the compressive strength value is approximately 5.6E7 (kg/m^2). FIG. 9B illustrates theoretical stresses generated by a three-prong wafer support fixture as a function of "point diameter," which is the diameter of the contact bluntness of each tip. As illustrated, the bluntness of each tip for this theoretical model should be at least about 0.0008 inch or greater when the wafer is pure silicon.

Figure 10:
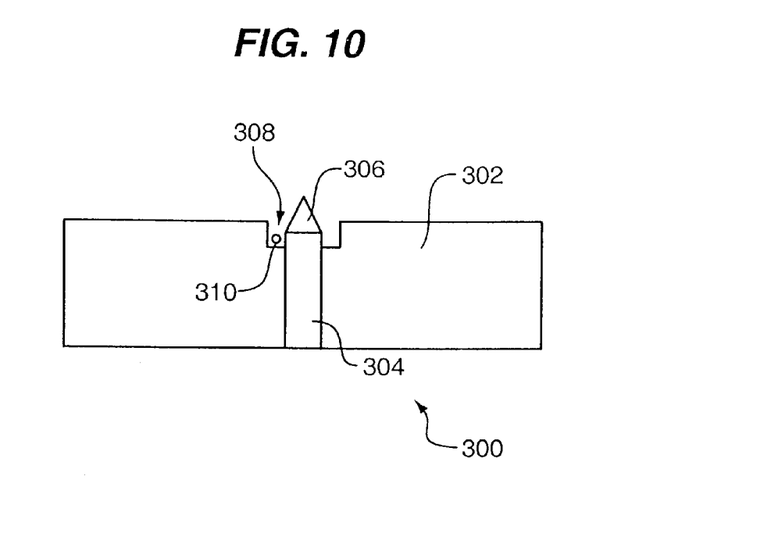
FIG. 10 shows one alternative configuration of a diamond stylus and steel base combination used in accord with the invention, including a trench to collect particulates.

One other preferably design feature of the invention is to provide a trench around the diamond stylus so as to collect particulates within the trench rather than onto the tip, such as shown in FIG. 10. That is, it has been shown through experimentation that extended use of the stylus design shown in FIG. 5A can result in an unwanted condition since particulates attach to the tip and eventually diminish its usefulness. FIG. 10 thus shows a preferred stylus configuration similar to FIG. 5A, except for the trench 308. In particular, by providing a trench (or "moat") around the stylus tip 306, particulates that form during operation tend to fall and collect within the trench 308, rather than on or about the tip 306.

FIG. 10 in particular illustrates an alternative or supplemental stylus and holder configuration 300 for mounting diamond-tipped wafer support structures into an end effector, e.g., the end effector 77 of FIG. 5. A base element 302, sized so as to fit within an end effector, holds the stainless steel shank 304. The diamond tip 306 mounts onto the shank 304. A trench 308 surrounds the tip 306 so that in the event particulates fall down or around the tip 306, they can be collected within the trench 308 until cleaned. Particulates such as the particulate 310 are sometimes created when the tip 306 impacts the wafer; and thus the trench 308 is a desirable feature.

Figure 11:
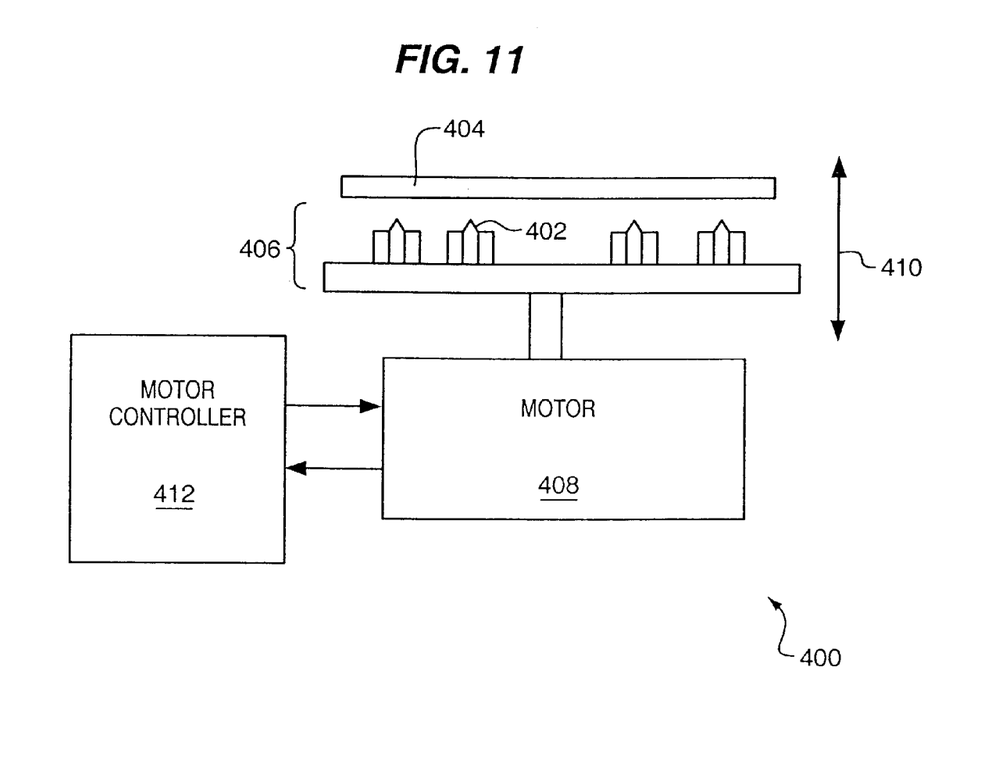
FIG. 11 shows a motor-controlled wafer handling fixture, including feedback, for controlling impact between the diamond tips and wafers, in accord with the invention.

FIG. 11 illustrates a wafer handling system 400 constructed according to the invention for carefully engaging diamond tips 402 relative to wafers 404. That is, wafer throughput in and out of processing chambers is important to improve production yields; and therefore there is a tendency to increase the acceleration at which such tips are driven to contact and carry the wafers. The problem is that high speeds can damage the tip at impact and/or reduce its performance. The system 400 thus diminishes this difficulty by changing the speed of motion so that the stylus contacts the wafer so as to make gentle contact. That is, high speeds are permitted except that a control loop monitors the distance between the stylus and the wafer; and thereafter decreases the acceleration so as to soften the impact.

FIG. 11 thus includes a four-prong diamond-tipped wafer support fixture 406 constructed in a manner such as described above. A motor 408 drives the fixture 406 relative to the wafer 404 in the direction 410 upon command from a motor controller 412. In operation, when the fixture 406 is needed to support the wafer 404 with an end effector—for subsequent transport in and between process chambers—the controller 412 drives the motor 408 so that the tips 402 are driven upwards to contact the wafer 404. At first, the motor is driven hard so that high accelerations are achieved; however, before the tips 402 contact the wafer 404, the fixturing 406 is decelerated so that contact between the tip 402 and wafer 404 is not damaging. In this manner, high wafer throughput is achieved, and the diamond tips are protected through a motor control loop.

The invention thus attains the objects set forth above, among those apparent from preceding description. Since certain changes may be made in the above apparatus and methods without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

In view of the foregoing, what is claimed is:

1. Wafer handling apparatus for use with a wafer handling mechanism of the type that supports and transports wafers through and during semiconductor processes, the wafer being of the type having a first surface for semiconductor processing and a second surface having a surface finish with microfeatures therein, comprising: at least three prongs extending from the mechanism and arranged to support the wafer, and a stylus tip at a distal end of each prong, each tip having a point that is smaller than at least some of the microfeatures of the second surface of the wafer such that the interaction of the tips with the microfeatures resists lateral movement of the wafer relative to the tips when the wafer rests on the tips by the force of gravity and without substantial contribution from the coefficient of friction between the tips and the wafer.

2. Wafer handling apparatus according to claim 1, wherein the tip is selected from the group consisting essentially of diamond, sapphire, molybdenum, tungsten and steel.

3. Wafer handling apparatus according to claim 1, wherein the tip comprises a diamond.

4. Wafer handling apparatus according to claim 1, wherein the tip is shaped into a point with an included angle of between about forty five and one hundred twenty degrees.

5. Wafer handling apparatus according to claim 1, further comprising an end effector for extending into and between one or more processing chambers, the prongs being mounted with and extending from the end effector.

6. Wafer handling apparatus according to claim 5, further comprising a plurality of steel bases for rigidly coupling the end effector to the prongs.

7. Wafer handling apparatus according to claim 6, wherein each base forms a trench around the prong so as to collect particulates therein.

8. Wafer handling apparatus according to claim 5, wherein the end effector forms a plurality of through-holes for mounting the prongs with the end effector.

9. Wafer handling apparatus according to claim 8, further comprising a plurality of plugs for mounting the prongs to the end effector.

10. Wafer handling apparatus according to claim 9, wherein each plug has one or more sloped sides for firm connection within the through-holes.

11. Wafer handling apparatus according to claim 9, wherein each plug forms a trench around the prong so as to collect particulates therein.

12. Wafer handling apparatus according to claim 1, wherein each prong comprises a shank and a stylus.

13. Wafer handling apparatus according to claim 12, wherein the shank comprises stainless steel and wherein the stylus comprises diamond.

14. Wafer handling apparatus according to claim 12, further comprising a braze joint for connecting the shank to the stylus.

15. Wafer handling apparatus according to claim 1, wherein the tip includes a flat portion that lessens the sharpness of the tip, the flat portion being between about 0.0005 and 0.0008 inch.

16. Wafer handling apparatus according to claim 1, further comprising a motor controller for driving the tips into contact with the wafer, the controller reducing the acceleration prior to impact with the wafer so as to reduce damage during impact between the tips and the wafer.

17. Wafer handling apparatus according to claim 1, wherein each stylus tip comprises bluntness, the tips being constructed and arranged such that stresses on the wafer caused by the bluntness of the tips is less than the compression strength of the wafer.

* * * * *